United States Patent
Ruttan et al.

(10) Patent No.: US 7,479,015 B2
(45) Date of Patent: Jan. 20, 2009

(54) SOCKET ASSEMBLY THAT INCLUDES IMPROVED CONTACT ARRANGEMENT

(75) Inventors: Thomas G. Ruttan, Lake Oswego, OR (US); Tieyu Zheng, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 59 days.

(21) Appl. No.: 11/427,898

(22) Filed: Jun. 30, 2006

(65) Prior Publication Data

US 2008/0003843 A1    Jan. 3, 2008

(51) Int. Cl.
*H01R 12/00* (2006.01)
(52) U.S. Cl. .......................... 439/66; 439/862; 439/74
(58) Field of Classification Search ............... 439/500, 439/636, 638, 862, 674
See application file for complete search history.

(56) References Cited

U.S. PATENT DOCUMENTS

| | | | |
|---|---|---|---|
| 5,380,210 A * | 1/1995 | Grabbe et al. | 439/66 |
| 5,975,914 A * | 11/1999 | Uchida | 439/66 |
| 6,388,207 B1 | 5/2002 | Figueroa et al. | |
| 6,400,576 B1 | 6/2002 | Davidson | |
| 6,495,770 B2 | 12/2002 | Li et al. | |
| 6,586,684 B2 | 7/2003 | Frutschy et al. | |
| 6,608,259 B1 | 8/2003 | Norskov | |
| 6,948,943 B2 | 9/2005 | Li | |
| 7,104,803 B1 * | 9/2006 | Lloyd et al. | 439/66 |
| 7,275,936 B1 * | 10/2007 | Ju et al. | 439/66 |
| 7,300,288 B1 * | 11/2007 | Chen et al. | 439/66 |
| 2005/0020146 A1 * | 1/2005 | McAlonis et al. | 439/862 |
| 2005/0135066 A1 * | 6/2005 | Lee et al. | 361/704 |
| 2005/0227509 A1 * | 10/2005 | Lloyd et al. | 439/66 |
| 2006/0014444 A1 * | 1/2006 | Searls et al. | 439/894 |
| 2006/0035483 A1 * | 2/2006 | Rathburn et al. | 439/65 |
| 2007/0105406 A1 * | 5/2007 | Li | 439/66 |
| 2008/0003843 A1 * | 1/2008 | Ruttan et al. | 439/66 |

* cited by examiner

*Primary Examiner*—James Harvey
(74) *Attorney, Agent, or Firm*—Schwegman, Lundberg & Woessner, P.A.

(57) ABSTRACT

In some embodiments, a socket assembly, electronic assembly and electronic system provide current paths for supplying power and I/O signals to a processor. The socket assembly includes a base having an upper surface and a lower surface with a plurality of contacts extending from the upper surface of the base. Each of the contacts is adjacent to another contact such that each of the contacts is part of a differential pair of contacts. Each of the contacts includes a first side and a second side. One of the contacts in each differential pair of contacts is oriented in one direction while the other contact in each differential pair of contacts is oriented in an opposing direction such that the first side of one of the contacts in each differential pair faces in an opposite direction to the first side of the other contacts in each differential pair.

10 Claims, 5 Drawing Sheets

SOCKET ASSEMBLY THAT INCLUDES IMPROVED CONTACT ARRANGEMENT

TECHNICAL FIELD

Some example embodiments of the present invention relate to a socket assembly and/or an electronic assembly that includes a processor, and more particularly, to a socket assembly and/or an electronic assembly with an improved contact arrangement for providing power and I/O signals to a processor.

BACKGROUND

The current paths in electronic assemblies that include processors are continually being required to handle ever-increasing amounts of I/O signals. Processors typically require additional I/O signals in order to address the ever-increasing functionality of new applications.

Power and I/O signals are typically delivered to the processor through a substrate using a socket (e.g., a land grid array) that is situated underneath the substrate where the processor is mounted. There is a strong incentive to increase the contact density of the sockets in order to provide additional I/O signals to the processor (among other reasons).

A typical land grid array (LGA) on a socket may include over 1000 contacts and often requires a compression load in order to adequately engage the contacts on the socket with pads on a substrate. The contacts in existing LGA's are typically arranged so that there is capacitive and inductive coupling between adjacent contacts. These adjacent contacts form a differential contact pair.

One drawback with reducing contact pitch in order to increase contact density is that the capacitive coupling increases between the contacts which are in adjacent differential contact pairs. The increased capacitive coupling between the contacts in adjacent differential contact pairs reduces the differential characteristic impedance of the contact pair according to the relationship $Zo=(L/C)^{1/2}$ (where L=the distributed inductance of the contact pair and C=the distributed capacitance).

When the differential characteristic impedance of a contact pair drops below an optimum value, the capacitive coupling between the contacts in adjacent differential contact pairs can negatively affect the high speed performance of a reduced-pitch socket. The optimum value of the differential characteristic impedance for each differential contact pair would be a value that matches the overall system differential impedance.

There is a need for a reduced pitch socket assembly where the arrangement of the contacts in the socket assembly minimizes capacitive coupling between the contacts that are in adjacent differential contact pairs. In addition, the socket assembly should minimize socket performance degradation as the data rate within electronic assemblies increases to greater than 20 Gb/s.

DETAILED DESCRIPTION

The following detailed description references the accompanying drawings. Like numerals describe substantially similar components throughout each of the drawings. Other embodiments may be used, and structural, logical, and electrical changes made. The socket assemblies and electronic assemblies described herein can be manufactured, used, or shipped in a number of positions and orientations.

In some embodiments, the socket assemblies and the electronic assemblies described herein provide a current path for supplying power and/or I/O signals to a processor. The socket assembly and the electronic assembly include a contact structure that improves the differential high speed performance of a processor.

The differential high-speed performance of the processor is enhanced by positioning the contacts to reduce the capacitive coupling between the edges of adjacent differential pairs of contacts. The contact structure also allows the socket assembly and the electronic assembly to be fabricated utilizing standard manufacturing and assembly processes.

The reduced capacitive coupling between the edges of adjacent differential contact pairs helps to maintain a differential impedance level for a reduced-pitch socket that is similar to non-reduced pitch sockets. Therefore, the contact structure serves to minimize system-level impedance mismatches and maintains high speed performance.

Figure 1:
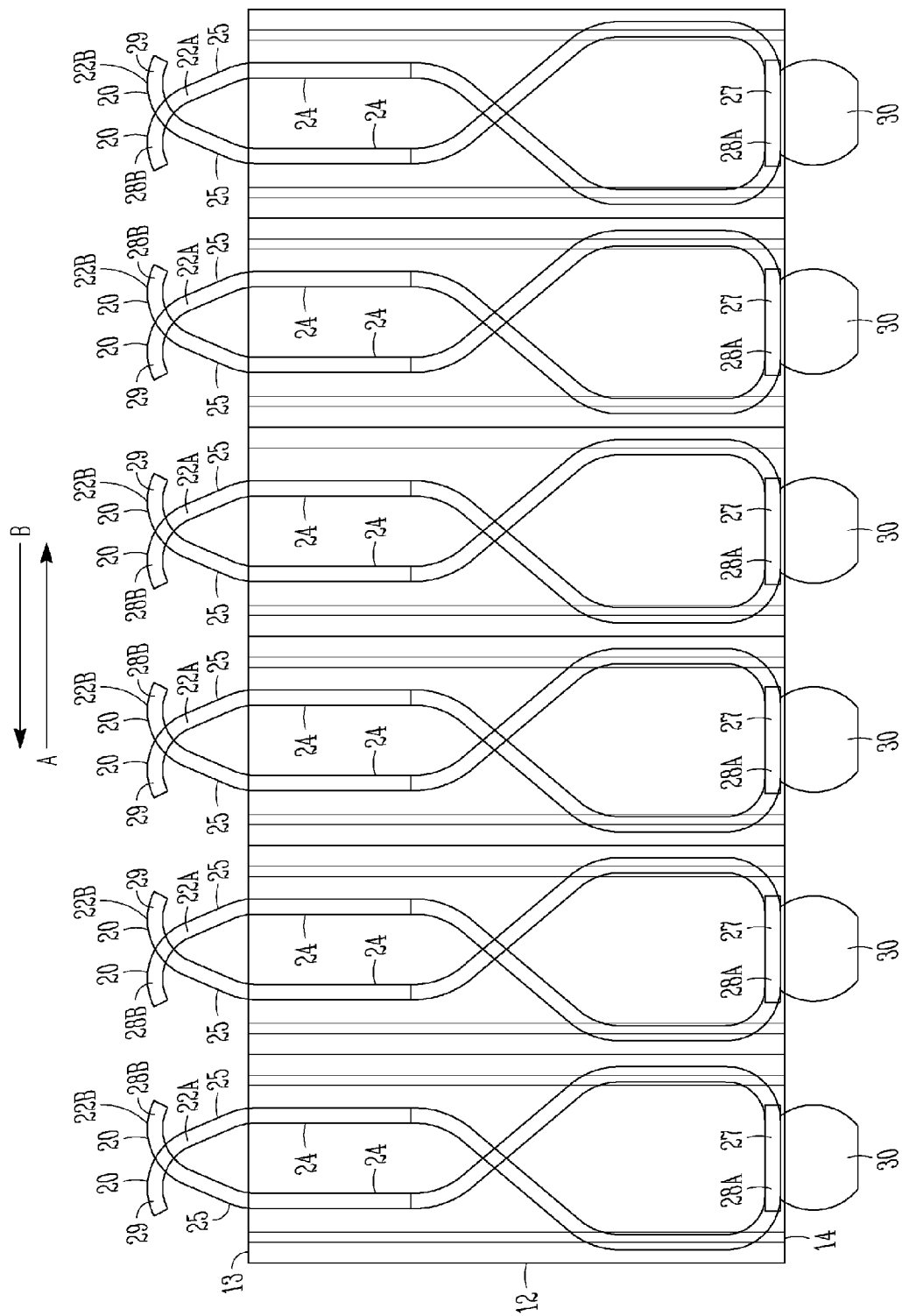
FIG. 1 is a schematic side view of a socket assembly.
Figure 2:
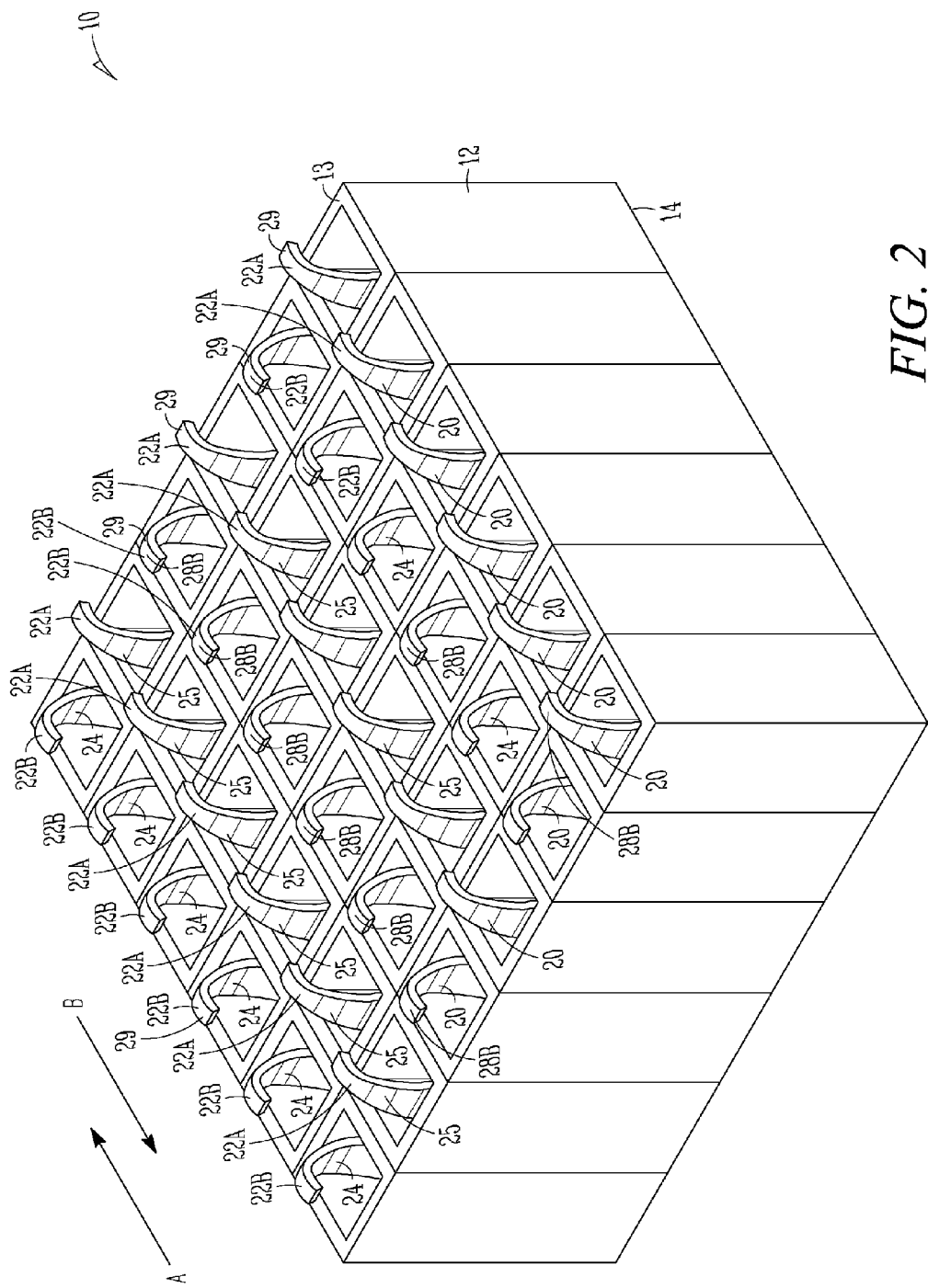
FIG. 2 is a perspective view of the socket assembly shown in FIG. 1.

FIGS. 1 and 2 illustrate a socket assembly that includes a base 12 having an upper surface 13 and a lower surface 14. The socket assembly 10 further includes a plurality of contacts 20 that extend from the upper surface 13 of the base 12. Each of the contacts 20 includes a first side 24 and a second side 25.

In addition, each of the contacts 20 is adjacent to another contact 20 such that each of the contacts 20 is part of a differential pair of contacts (formed of a contact 21A and a contact 22B). As an example, one of the contacts 22A in each differential pair 22A of contacts 20 is oriented in one direction A while the other contact 22B in each differential pair of contacts 20 are oriented in an opposing direction B such that the first side 24 of each contact 22A faces in an opposite direction B to the first side 24 of each contact 22B.

Arranging each of the contacts 20 in each differential pair of contacts 22A, 22B in this manner reduces the capacitive coupling between the edges of the contacts 20 that are in each differential contact pair 22A, 22B. Reducing the capacitive coupling between the edges of the contacts 20 that are in adjacent differential contact pairs 22A, 22B is especially important when the socket assembly 10 is formed with a reduced pitch to increase contact density. In addition, when the capacitive coupling between the contacts 20 that forms a differential contact pair 22A, 22B is reduced, the differential characteristic impedance of each contact pair 22A, 22B does not decrease such that the high frequency impedance of the socket assembly 10 is more readily matched to an overall electronic system.

Figure 3:
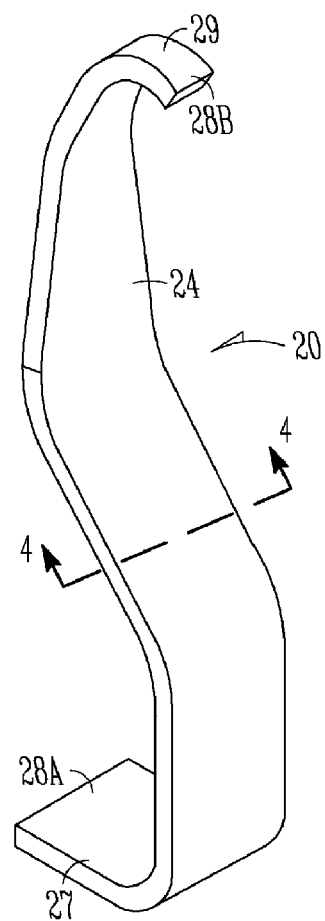
FIG. 3 is a perspective view of an example contact that may be used in the socket assembly shown in FIGS. 1 and 2.

As shown in FIG. 3, at least some of the contacts 20 may include an L-shaped section 27 at one end 28A of the contact 20 and a J-shaped section 29 at an opposing end 28B of the contact 20. In some embodiments, the L-shaped section 27 of each contact 20 may be exposed through the lower surface 14 of the base 12 so that solder balls 30 (see FIG. 1) may be attached to the L-shaped section 27 of each contact 20. In some embodiments, the base 12 and the contacts 20 may be designed such that the contacts 20 are each snapped into the base 12. In some forms, base 12 is made of a material (e.g., plastic) that is adapted to handle compressive loads.

In some embodiments, the contacts 20 may be a combination of power contacts (i.e., contacts that provide power to a processor) and I/O contacts (i.e., contacts that provide I/O signals to a processor). As shown in FIG. 2, the contacts 20 may be formed in a land grid array.

Although the contacts 20 are shown as being arranged in a land grid array, the contacts 20 may be positioned in other arrangements as long as one of the contacts 22A in each differential pair 22A, 22B is rotated 180 degrees relative to the other contact 22B in each differential pair 22A, 22B. In addition, the number, size and type of contacts 20 may vary depending on the design of the socket assembly 10.

Figure 4:
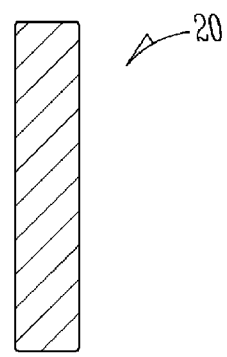
FIG. 4 is a section view of the example contact shown in FIG. 3 taken along line 4-4.

In some embodiments, the first side 24 of each contact 20 may have a different shape than the second side 25 of each contact 20, while in other embodiments the first side 24 of each contact 20 may have the same shape as the second side 25 of each contact 20. Although FIG. 4 shows that each of the contacts 20 may have a rectangular cross-section, it should be noted that other sizes and shapes for the cross-section of each contact 20 are contemplated.

Figure 5:
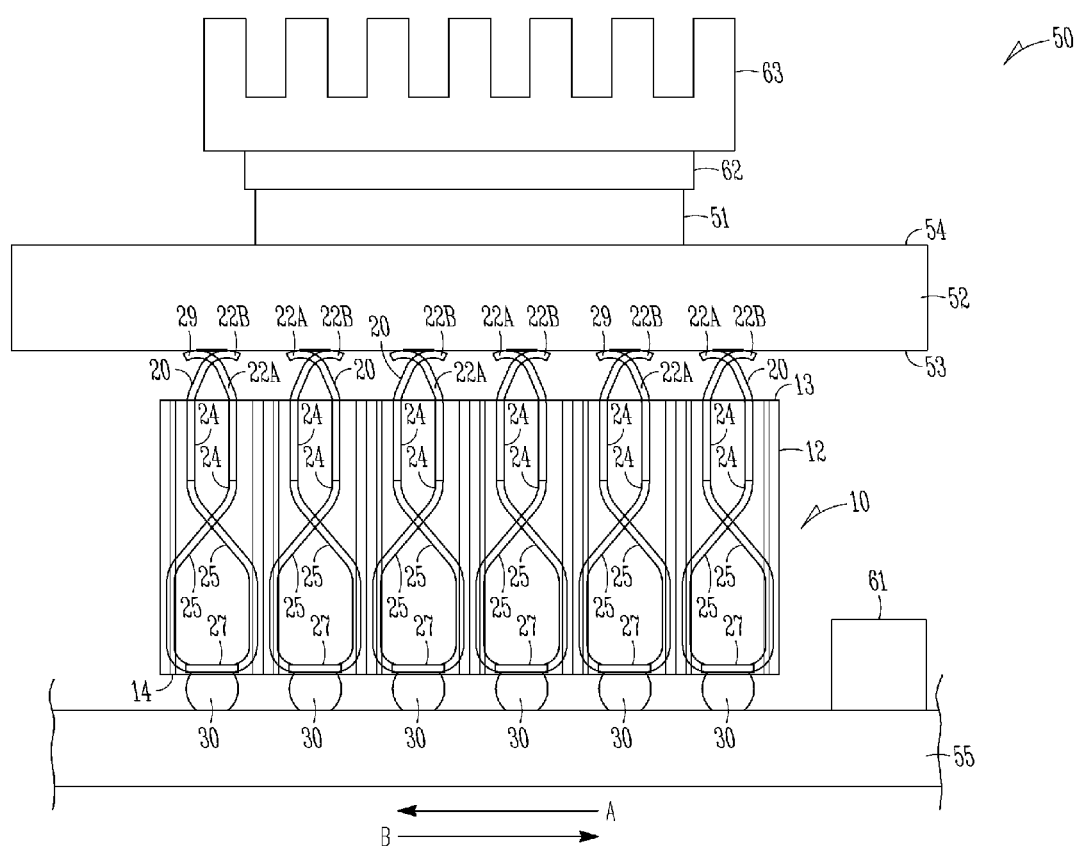
FIG. 5 is a schematic side view illustrating an electronic assembly that incorporates the socket assembly shown in FIGS. 1 and 2.

FIG. 5 illustrates an example embodiment of an electronic assembly 50 that includes socket assembly 10. The electronic assembly 50 further includes a die 51 and a substrate 52 that has a lower side 53 and an upper side 54. The die 51 is mounted to the upper side 54 of the substrate 52 while the lower side 53 of the substrate 52 engages the contacts 20 that extend from the upper surface 13 of the base 12.

In some forms, die 51 may be made of semiconducting material that has been separated from a wafer. Wafers may be made of semiconducting, non-semiconducting, or combinations of semiconducting and non-semiconducting materials.

In some embodiments, electronic assembly 50 may include a motherboard 55 that is positioned adjacent to the lower surface 14 of base 12 such that the motherboard 55 is electrically coupled to the solder balls 30 that are part of the socket assembly 10.

The electronic assembly 50 may further include a voltage source 61 that is electrically coupled to the die 51. Although the example voltage source 61 is shown in FIG. 5 as being mounted on the motherboard 55, it should be noted that the voltage source 61 may be mounted on the substrate 52 or any other location.

A heat spreader 62 may be coupled to the die 51 to remove heat from the die 51 during operation of electronic assembly 50. Electronic assembly 50 may further include a heat sink 63 that is coupled to the heat spreader 62. In some forms, heat sink 63 may be coupled directly to die 51.

As discussed above, the contacts 20 that make up socket assembly 10 may be formed of power contacts and I/O contacts. In some embodiments, the I/O contacts 20 may be located directly below the die 51 to minimize the distance between the I/O contacts and the die 51.

Electronic assembly 50 may be adapted for use with a variety of different electronic devices. In some embodiments, the components in the electronic assembly 50 will be determined based on the space available and the application where the electronic assembly 50 is to be used (among other factors).

Figure 6:
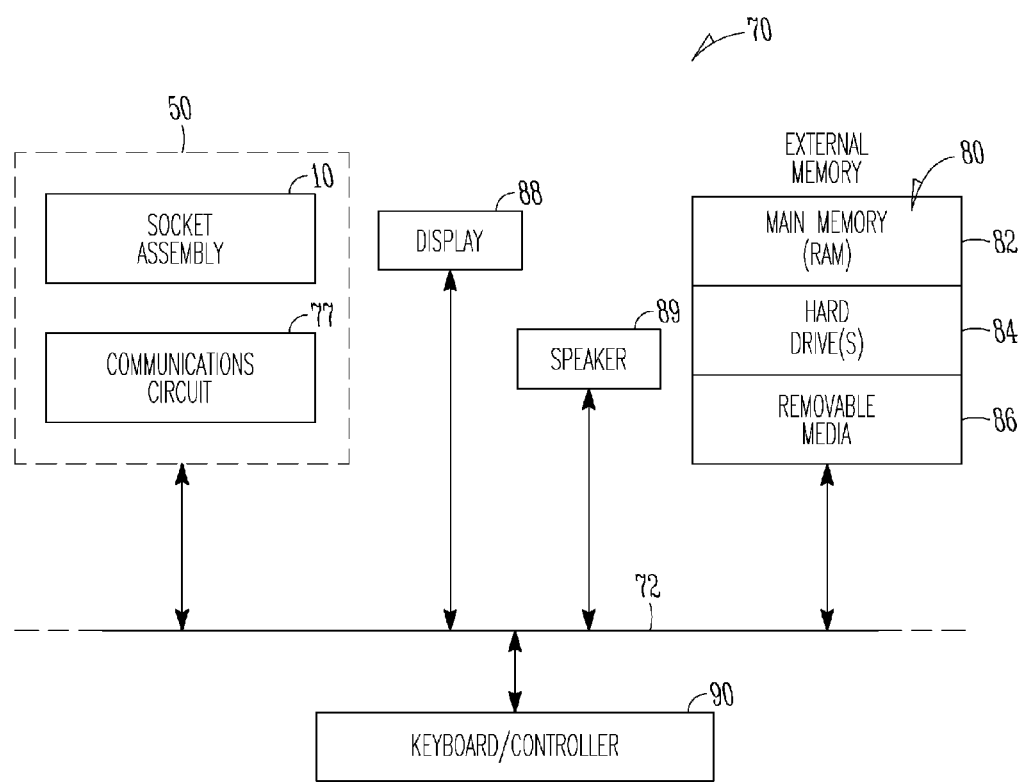
FIG. 6 is a block diagram of an electronic system that incorporates the electronic assembly shown in FIG. 5.

FIG. 6 is a block diagram of an electronic system 70 incorporating at least one electronic assembly (e.g., electronic assembly 50 shown in FIG. 5) described herein, which includes one or more types of socket assemblies (e.g., socket assembly 10 shown in FIGS. 1 and 2) described herein. Electronic system 70 may be a computer system that includes a system bus 72 which electrically couples the various components of electronic system 70 together. System bus 72 may be a single bus or any combination of busses.

Electronic assembly 50 is electrically coupled to system bus 72 and may include any circuit, or combination of circuits. In one embodiment, electronic assembly 50 includes one or more of the socket assemblies 10 described herein.

In addition, electronic assembly 50 may include a processor which can be of any type. As used herein, processor means any type of circuit such as, but not limited to, a microprocessor, a microcontroller, a graphics processor or a digital signal processor.

Other types of circuits that may be included in electronic assembly 50 (or electrically coupled to electronic assembly 50) are a custom circuit or an application-specific integrated circuit, such as communications circuit 77 for use in wireless devices such as cellular telephones, pagers, portable computers, two-way radios, and similar electronic systems.

Electronic system 70 may also include an external memory 80 that in turn may include one or more memory elements suitable for the particular application, such as a main memory 82 in the form of random access memory (RAM), one or more hard drives 84, and/or one or more drives that handle removable media 86, such as diskettes, compact disks (CDs) and digital video disks (DVDs).

The electronic system 70 may also include a display device 88, a speaker 89, and a controller 90, such as a keyboard, mouse, trackball, game controller, microphone, voice-recognition device, or any other device that inputs information into the electronic system 70.

The socket assemblies and electronic assemblies described herein may be implemented in a number of different embodiments, including an electronic package, an electronic system and/or a computer system. The elements, materials, geometries, dimensions, and sequence of operations can all be varied to suit particular packaging requirements.

FIGS. 1-6 are merely representational and are not drawn to scale. Certain proportions thereof may be exaggerated while others may be minimized.

The socket assemblies and electronic assemblies described above may provide a solution for supplying power and I/O signals to a die using a reduced-pitch socket assembly without sacrificing the differential high speed performance of the processor. The arrangement of the contacts reduces the capacitive coupling between the edges of the contacts that are in a differential contact pair in order to avoid lowering the differential characteristic impedance of each differential pair of contacts below an optimum value even when the socket is form at a reduced pitch. Many other embodiments will be apparent to those of skill in the art from the above description.

What is claimed is:

1. A socket assembly comprising:
   a base that includes an upper surface and a lower surface, the base further including a plurality of cavities that extend from the upper surface to the lower surface; and
   a plurality of contacts, each of the contacts being positioned within a unique one of the cavities in the base, each of the contacts being adjacent to another contact such that each of the contacts is part of a differential pair of contacts, each of the contacts including a first side and a second side, one of the contacts in each differential pair of contacts is oriented in one direction while the other contact in each differential pair of contacts is oriented in an opposing direction such that the first side of one contact in each differential pair faces in an opposite direction to the first side of the other contact in each first differential pair, wherein at least some of the contacts include an L-shaped section at one end of the contact and a J-shaped section at an opposing end of the contact such that the J-shaped section extends above the upper surface of the base.

2. The socket assembly of claim 1, wherein at least some of the contacts are formed in a land grid array.

3. The socket assembly of claim 1, further comprising a plurality of solder balls such that each solder ball is attached to an L-shaped section on one of the contacts.

4. An electronic assembly comprising:

a socket assembly that includes a base and a plurality of contacts, the base including an upper surface and a lower surface as well as a plurality of cavities that extend from the upper surface to the lower surface such that each of the contacts is positioned within a unique one of the cavities in the base, each of the contacts being adjacent to another contact such that each of the contacts is part of a differential pair of contacts, each of the contacts including a first side and a second side, one of the contacts in each differential pair of contacts is oriented in one direction while the other contact in each differential pair of contacts is oriented in an opposing direction such that the first side of one contact in each differential pair faces in an opposite direction to the first side of the other contact in each first differential pair, wherein at least some of the contacts include an L-shaped section at one end of the contact and a J-shaped section at an opposing end of the contact such that the J-shaped section extends above the upper surface of the base;

a die; and a substrate that includes a lower side and an upper side, the lower side of the substrate engaging the contacts that extend from the upper surface of the socket assembly, and the die being mounted to the upper side of the substrate.

5. The electronic assembly of claim 4, further comprising a motherboard positioned adjacent to a lower surface of the base, the motherboard being electrically coupled to the contacts by a pattern of solder balls.

6. The electronic assembly of claim 4, further comprising a heat spreader coupled to the die and a heat sink coupled to the heat spreader.

7. The electronic assembly of claim 4, further comprising a voltage source that is electrically coupled to the die, wherein the voltage source is mounted on the motherboard.

8. An electronic system comprising:

a bus;

a random access memory coupled to the bus;

an electronic assembly coupled to the bus, the electronic assembly including a socket assembly that has a base and a plurality of contacts, the base including an upper surface and a lower surface as well as a plurality of cavities that extend from the upper surface to the lower surface such that each of the contacts is positioned within a unique one of the cavities in the base, each of the contacts being adjacent to another contact such that each of the contacts is part of a differential pair of contacts, each of the contacts including a first side and a second side, one of the contacts in each differential pair of contacts is oriented in one direction while the other contact in each differential pair of contacts is oriented in an opposing direction such that the first side of one contact in each differential pair faces in an opposite direction to the first side of the other contact in each first differential pair, wherein at least some of the contacts include an L-shaped section at one end of the contact and a J-shaped section at an opposing end of the contact such that the J-shaped section extends above the upper surface of the base, the electronic assembly further including a die and a substrate that includes a lower side and an upper side, the lower side of the substrate engaging the J-shaped sections of the contacts, the die being mounted to the upper side of the substrate; and a voltage source to provide power and I/O signals to the die through the contacts.

9. The electronic system of claim 8, wherein the electronic assembly further includes a motherboard that is attached to the L-shaped sections of the contacts by a pattern of solder balls.

10. The electronic system of claim 8, wherein at least some of the contacts are formed in a land grid array.

* * * * *